US012382712B2

United States Patent
Baumgartner et al.

(10) Patent No.: US 12,382,712 B2
(45) Date of Patent: Aug. 5, 2025

(54) SEMICONDUCTOR DIES AND DEVICES WITH FRONTSIDE AND BACKSIDE COILS FOR INDUCTIVE COUPLING

(71) Applicant: Intel Corporation, Santa Clara, CA (US)

(72) Inventors: Peter Baumgartner, Munich (DE); Joachim Assenmacher, Unterhaching (DE); Walther Lutz, Erding (DE); Martin Ostermayr, Woerth (DE); Georg Seidemann, Landshut (DE)

(73) Assignee: Intel Corporation, Santa Clara, CA (US)

( * ) Notice: Subject to any disclaimer, the term of this patent is extended or adjusted under 35 U.S.C. 154(b) by 804 days.

(21) Appl. No.: 17/448,738

(22) Filed: Sep. 24, 2021

(65) Prior Publication Data

US 2023/0101378 A1    Mar. 30, 2023

(51) Int. Cl.
    *H10D 84/40*      (2025.01)
    *H01L 23/522*      (2006.01)
    *H01L 23/532*      (2006.01)
    *H10D 1/20*      (2025.01)

(52) U.S. Cl.
CPC ......... *H10D 84/40* (2025.01); *H01L 23/5227* (2013.01); *H01L 23/53257* (2013.01); *H10D 1/20* (2025.01)

(58) Field of Classification Search
CPC ............. H01L 27/0617; H01L 23/5227; H01L 23/53257; H01L 28/10; H01L 23/5286; H01L 23/535; H01L 27/0694
See application file for complete search history.

(56) References Cited

U.S. PATENT DOCUMENTS

| | | | |
|---|---|---|---|
| 10,026,801 B2* | 7/2018 | Huang | H10D 84/40 |
| 2014/0035146 A1* | 2/2014 | Kim | H01L 23/485 |
| | | | 257/773 |
| 2015/0108606 A1* | 4/2015 | Lamy | H01L 28/40 |
| | | | 257/532 |
| 2017/0005046 A1* | 1/2017 | Sin | H01L 27/0694 |
| 2022/0173046 A1* | 6/2022 | Gomes | H01L 23/5286 |
| 2022/0406717 A1* | 12/2022 | Lanzillo | H01L 23/5226 |
| 2023/0034737 A1* | 2/2023 | Wang | H01L 24/24 |
| 2023/0402367 A1* | 12/2023 | Wu | H01L 23/528 |
| 2024/0030128 A1* | 1/2024 | Lee | H10B 12/00 |

* cited by examiner

*Primary Examiner* — John P. Dulka
(74) *Attorney, Agent, or Firm* — 2SPL Patent Attorneys PartG mbB; Yong Beom Hwang (57) ABSTRACT

A semiconductor die is disclosed, including a plurality of transistors at a frontside of a semiconductor substrate, a backside inductor at a backside of the semiconductor substrate; and a frontside inductor at the frontside of the semiconductor substrate. The frontside inductor and the backside inductor are inductively coupled.

20 Claims, 7 Drawing Sheets

SEMICONDUCTOR DIES AND DEVICES WITH FRONTSIDE AND BACKSIDE COILS FOR INDUCTIVE COUPLING

FIELD

Examples relate to semiconductor dies and devices with transistors.

BACKGROUND

Semiconductor devices have numerous applications. Power and signal lines can be coupled to the transistors of semiconductor dies and may form part of a working device. Several challenges can arise when forming power and/or signal connections to the transistors.

BRIEF DESCRIPTION OF THE FIGURES

Some examples of apparatuses and/or methods will be described in the following by way of example only, and with reference to the accompanying figures, in which.

DETAILED DESCRIPTION

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an 'or', this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

Herein, a trailing "(s)" means one or more; for example "transistor(s)" can be one or more transistors.

Herein, a semiconductor substrate can be made of materials including, for example, n-type or p-type materials systems (or a combination of both). The substrate may include, for example, a crystalline substrate formed using a bulk silicon or a silicon-on-insulator (SOI) substructure. In some embodiments, the substrate may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate.

Herein, the transistors may be metal oxide semiconductor field-effect transistors (MOSFETs) and/or FinFETs, e.g. formed using a semiconductor substrate. The is much interest in reducing the size of semiconductor dies/devices, particularly those that utilize FinFETs. The examples herein are however not necessarily limited to semiconductor dies that include FinFETs. A wide variety of other types and configurations such as, for example, planar transistors, non-planar transistors, or a combination of both can be used in combination with the inductor(s) described herein. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors. The transistors depicted herein may include additional specific features thereof not depicted or not described for the sake of clarity/brevity, such as device isolation regions, gate contacts, and the like.

Herein inductively coupled inductors (e.g. front and backside inductors, particularly the respective windings thereof) can be aligned. The alignment can be such that the respective windings are offset from each other in a direction connecting the frontside and backside of the semiconductor substrate. The alignment may be so as to have efficient transfer of magnetic energy from one inductor to the other.

Figure 1:
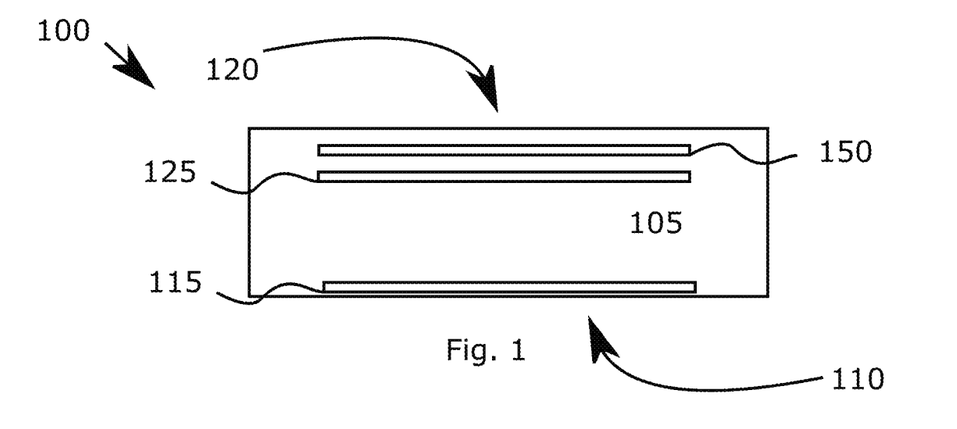
FIG. 1 illustrates a semiconductor die.

FIG. 1 illustrates a semiconductor die 100. Features described herein with respect to the die of FIG. 1 can be combined with other dies described herein. The die can have a plurality of transistors 150 (e.g. FinFETs) at a frontside 120 of a semiconductor substrate 105, a backside inductor 115 at a backside 110 of the semiconductor substrate 105, and a frontside inductor 125 at the frontside 120 of the semiconductor substrate. The frontside inductor 125 and the backside inductor 115 can be inductively coupled, such as for power and/or signals which may be coupled to/from at least one of the transistors 150. There may be electrical coupling, e.g. by a conductive path (such as provided by a power line and/or buried power rail), between the frontside inductor 125 and one or more of the transistors 150.

Figure 2:
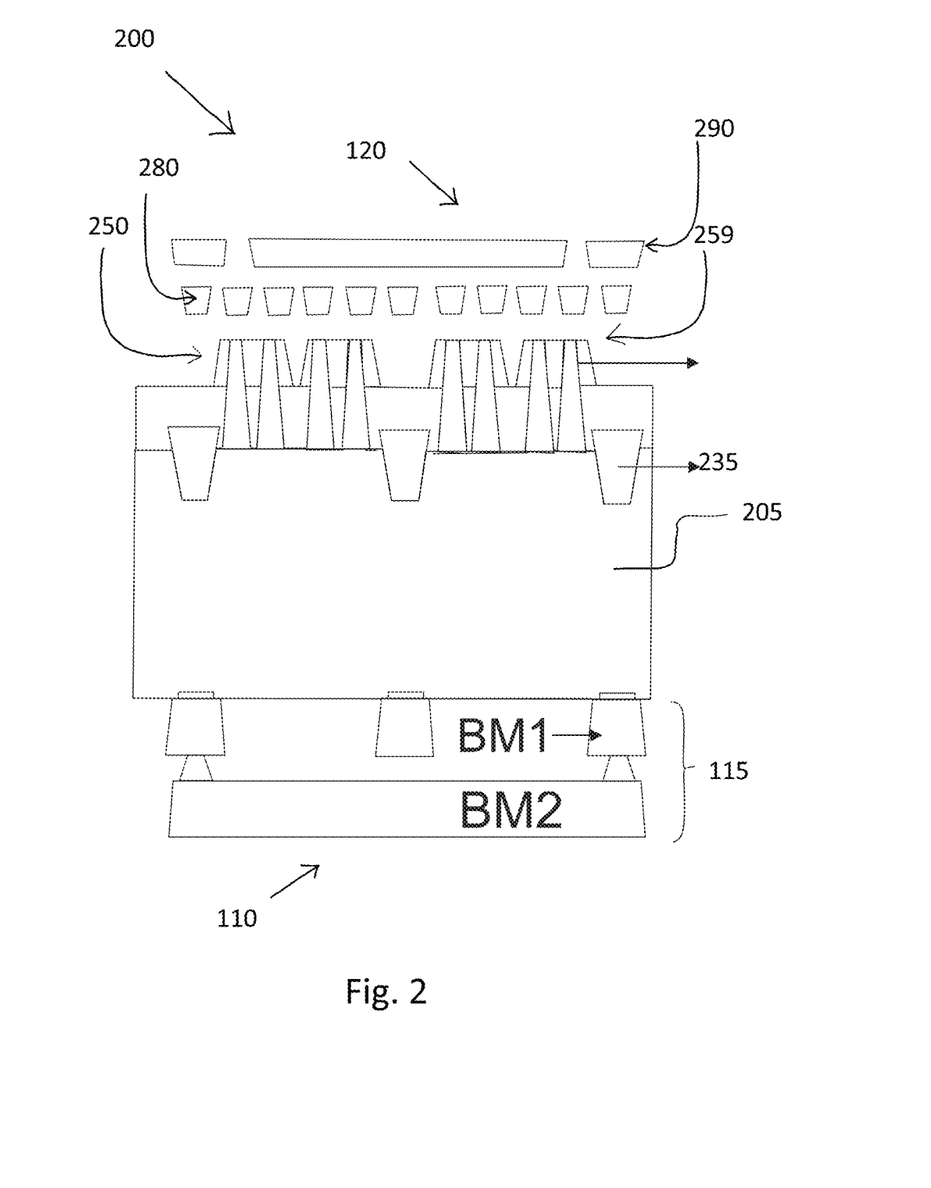
FIG. 2 illustrates a semiconductor die.

FIG. 2 illustrates a semiconductor die 200. Features described herein with respect to the die of FIG. 2 can be combined with other dies described herein. The die 200 of FIG. 2 includes features which can be incorporated into the die 100 of FIG. 1, and vice versa. FIG. 2 shows the frontside 120 and the backside 110 of the die 200. FIGS. 1 and 2 can be regarded as X-Z cross sections of semiconductor dies 100, 200.

As shown in FIG. 2, at least a part of the frontside conductor 125, can be formed by an electrically conductive line 235, e.g. a power supply line, which can be between the frontmost part 259 of the transistors 150 (toward the top of FIG. 2) and the semiconductor substrate 205. The electrically conductive line 235, as shown in FIG. 2, can be arranged vertically between a gate 250 of a transistor of the transistors 150 and the semiconductor substrate 105. The material of the conductive line and/or power supply line 235 may include, for example, tungsten or ruthenium. For example, the material is at least 90% tungsten, such as at least 99% tungsten.

Part of the electrically conductive line 235 and/or frontside inductor 125 can be in a plane which is between the frontmost part of the transistors 150 and the semiconductor substrate 205. For example, a coil of the frontside inductor 125 can be in such a plane. For example, the frontside conductor 125 can have a single winding, such as a single winding in the plane between the frontmost part 259 and the substrate 205. The single winding may be the only winding of the frontside inductor 125.

The frontside inductor 125 can include a part that is formed by a metal line above the plurality of transistors, e.g. between the frontmost surface of the die an the frontmost part 259 of the transistors 150. For example, the frontside inductor 125 can have windings in more than one plane. There may be a first winding in the plane between the frontmost part of the transistors 150 and the semiconductor substrate 205 and a second winding in a plane on the opposite side of the transistors 150 from the first winding.

The frontside inductor 125 can be electrically connected to a source region or a drain region of a transistor of the plurality of transistors 150.

FIG. 2 shows metallizations 280 and 290 at the frontside 120 of the die 200 which may be additional metallizations for more power and/or signals. The metallizations 280, 290 may be coupleable to additional windings of the frontside inductor 125 or may be additional frontside inductors (e.g. that couple inductively to backside inductor(s)) or possibly to external inductor(s).

At the backside 110, FIG. 2 shows backside metallizations BM1, BM2. The backside metallizations BM1, BM2 may form a power distribution network. FIG. 2 shows two layers of backside metallization BM1, BM2, although more or fewer are possible. The backside metallizations may form at least par of the backside inductor 115.

The material of the frontside inductor 125 includes metal, such as copper or aluminum (Cu or Al). The material may be at least 90% or at least 99% copper, or at least 90% Al, or at least 99% Al. The material of the backside inductor 115 includes metal, such as Cu, Al, or tungsten (W). The material may be at least 90% or at least 99% copper. The material may be an alloy of Cu and Al, such as a more than 80% (Cu and Al).

There may be circuitry, e.g. which includes the transistors 150 and/or the conductive line 235 (e.g. power supply line), which is provided at least one of a power supply signal, a data signal, or a clock signal. The die may provide the power supply signal, data signal, and/or clock signal from the backside inductor 115 inductively coupling to the frontside inductor 125. This kind of coupling can reduce the footprint of the die. For example, the die 100, 200 may be formed with fewer vias (e.g. through semiconductor vias). It is possible to form the die 100, 200 without using any vias.

In another example, the circuitry can be unlocked by the power supply signal, the data signal, and/or the clock signal. The die may have or may form part of a security feature such as for chip/device security. In an example, electronic access is enabled after a recognized signal (e.g. a data signal and/or security signal) is received by the frontside inductor 125 (e.g. from the backside inductor 115). The circuitry may be configured to determine if the received signal meets specified conditions to allow access and/or operation of a device. For example, a recognized signal triggers operation or unlocking of the device and/or a device. The conditions may include a frequency, an amplitude, and/or a phase of the received signal. Additionally, the conditions for unlocking may include particular sequences, e.g. sequences of modulations of frequency, amplitude, phase, and/or pulses.

As shown in FIG. 2, the backside inductor 115 can have at least one layer of metallizations (e.g. BM1, BM2). The backside inductor 115 can have at least one winding. For example, each layer of metallization may have a coil of the backside inductor 115.

Figure 3:
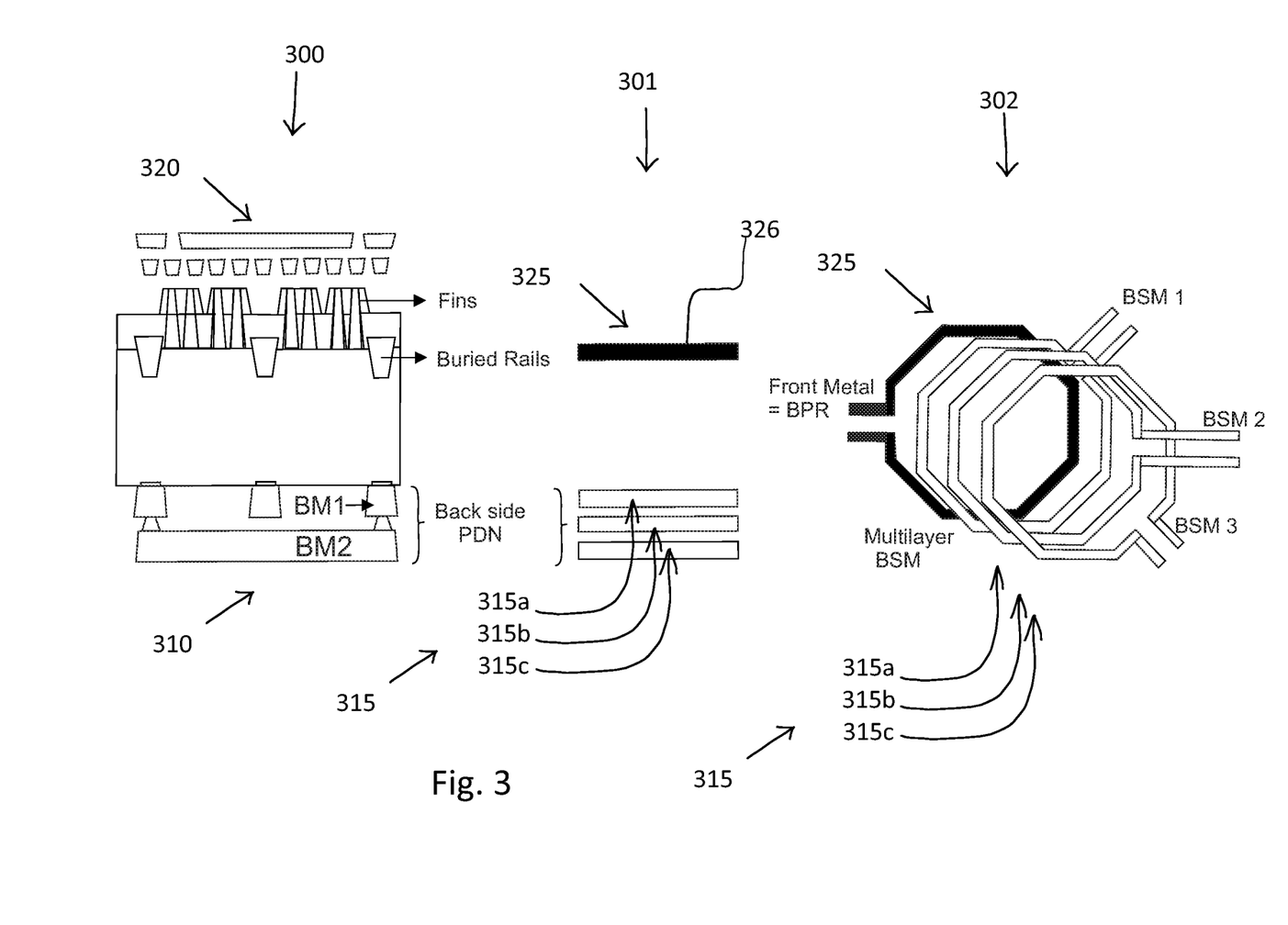
FIG. 3 illustrates a semiconductor die.

FIG. 3 shows a semiconductor die 300. Features described herein with respect to the die of FIG. 3 can be combined with other dies described herein. As shown in FIG. 3, there is a frontside 320 and backside 310 of the semiconductor substrate 105. FIG. 3 schematically shows the positions of the frontside and backside inductors 325, 315 in the side view 301 and top view 302. The middle view shows a plane 326 in which the frontside inductor 325 is at the frontside 120. The backside inductor 315 of FIG. 3 has more than one coil 315a, 315b, 315c which, as shown, may be in different planes at the backside 310. The top view 302 illustrates a geometry to show a frontside inductor 325 (of, in this case, one winding, although more is possible) which can be inductively coupled with a backside inductor 315 (of, in this case three windings 315a, 315b, and 315c, although more or fewer is possible). Each winding can be formed during one metallization, e.g. each at a respective layer of the die 300. As shown in FIG. 3, there are three layers of backside metallizations BSM1, BSM2, BSM3 (more or fewer are possible) which may form the windings 315a. 315b, 315c and/or the backside inductor 315.

The backside inductor 315 may include at least one winding forming an open loop in a plane at the backside 310. As shown in the top view 302 of FIG. 3, the backside inductor 315 can connect to an electrically conductive line, a buried power rail (BPR), and/or a power supply line.

FIG. 3 shows the optional additional metallizations 280, 290 at the frontside 320 that are also depicted in FIG. 2. As in FIG. 2, there may be a coil for the frontside inductor 325 that is at least partially buried in the semiconductor substrate 205 (e.g. extending at least partially into the material of the semiconductor substrate 205). A material for preventing metal migration into the semiconductor material may be present, e.g. an oxide and/or nitride (the material being between the coil for the inductor and the semiconductor material). There may be one or more additional coils of the frontside inductor 325 and/or frontside inductors above the transistors 250 (e.g. above the gates of the transistors 250).

The backside inductor 315, as shown in FIG. 3, can be formed in a plurality of layers of metallizations. Alternatively/additionally, a die 300 can have multiple backside inductors at different layers of metallizations. Multiple signals can be provided/supported in the die by having multiple backside inductor(s), e.g. by having more than one layer of metallizations.

Figure 4:
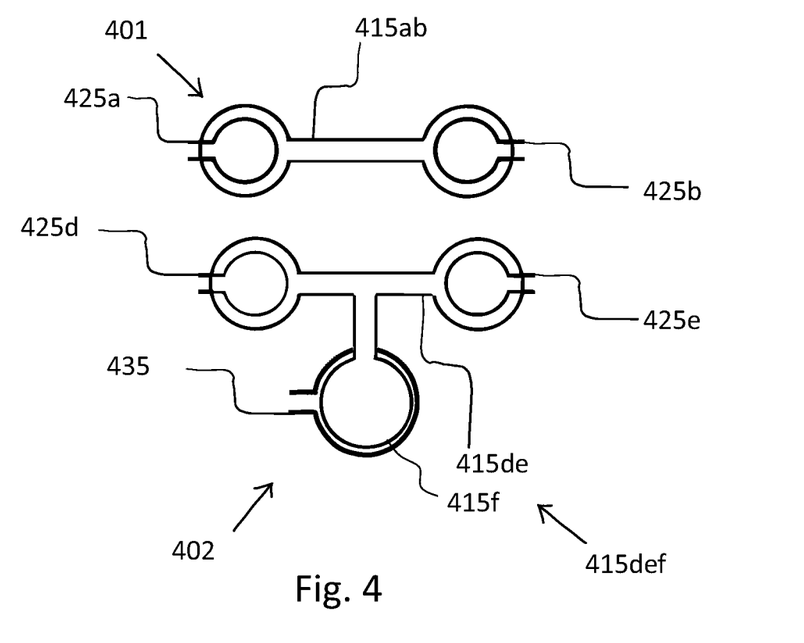
FIG. 4 illustrates configurations of inductors.

FIG. 4 illustrates configurations of inductors. The configurations described with respect to FIG. 4 can be utilized with the respective inductors (frontside, backside, and/or external) described elsewhere herein. The views of FIG. 4 are toward the XY plane, and illustrate relative positions of inductor coils in various possible configurations. Signals and/or supplied power (e.g. from a backside inductor 415ab) can be distributed to multiple regions of the die such as by having multiple frontside inductor(s), 425a, 425b. Space on the die can be more efficiently used and/or power efficiency can be increased.

At the top of FIG. 4 is a first configuration 401 in which a backside inductor 415ab is coupled to more than one frontside inductor 425a, 425b. The backside inductor 415ab is in a different plane than the frontside inductors 425a, 425b. The frontside inductors 425a, 425b can be in the same plane (e.g. laterally offset from each other in a plane at the frontside 110 of a semiconductor substrate 105) or can be in different planes. The backside inductor 415ab can, for example, power two circuits at different regions of the die, by inductively coupling power to the frontside inductors 425a, 425b. Alternatively/additionally, the backside inductor 415ab can provide a signal and/or data to different regions/circuits of the die, by inductively coupling to the frontside inductors 425a, 425b.

A plurality of frontside inductors 425a, 425b can be positioned in a plane of the semiconductor die so as to inductively couple to at least one backside inductor 415ab. The first configuration 401 shown in FIG. 4 allows the inductive coupling of multiple frontside inductors 425a, 425b with one backside inductor 415ab. It is possible to have more than one backside inductor 415ab as well, such as to provide different powers, signals, and/or data to different regions/circuits of the die.

At the bottom of FIG. 4 is a second configuration 402 which has backside inductor 415def inductively coupled to at least one frontside inductor 425d, 425e. In the second configuration 402, the backside inductor 415def can also couple to an external inductor 435.

Alternatively/additionally, a semiconductor die can have a backside inductor 415de which is electrically connected to a second backside inductor 415f at the backside of the semiconductor substrate. The second backside inductor 415f can be configured to inductively couple to an external inductor 435, a first frontside inductor 425a, and/or a second frontside inductor 425b. The frontside inductor(s) 425a, 425b can be at the frontside of the semiconductor substrate.

The external inductor 435 may provide power, data, and/or a signal to the backside inductor 415def which may then distribute the power, data, and/or signal (e.g. a clock and/or security signal) to the circuitry and/or transistors of the die.

The two configurations 401, 402 of FIG. 4 show backside inductors 415ab, 415def which have closed loops in the plane of the coils. Power can be coupled to at least one backside inductor by using an external inductor 435.

A first backside inductor can be electrically connected to a second backside inductor at the backside of the semiconductor substrate. The second backside inductor can inductively couple to an external inductor. It is also possible that one or more of the backside inductors (e.g. the second backside inductor) can inductively couple to a second frontside inductor at the frontside of the semiconductor substrate. A second frontside inductor can be on the opposite side of the transistors from a first frontside inductor.

External inductor 435 can be at a package or board level, e.g. external to the die which includes the transistors and frontside inductors. The external inductor can be on a module that is bonded to the die (e.g. a second die), or on a package attached to the die, or external thereto such as on a circuit board.

Figures 5, 8:
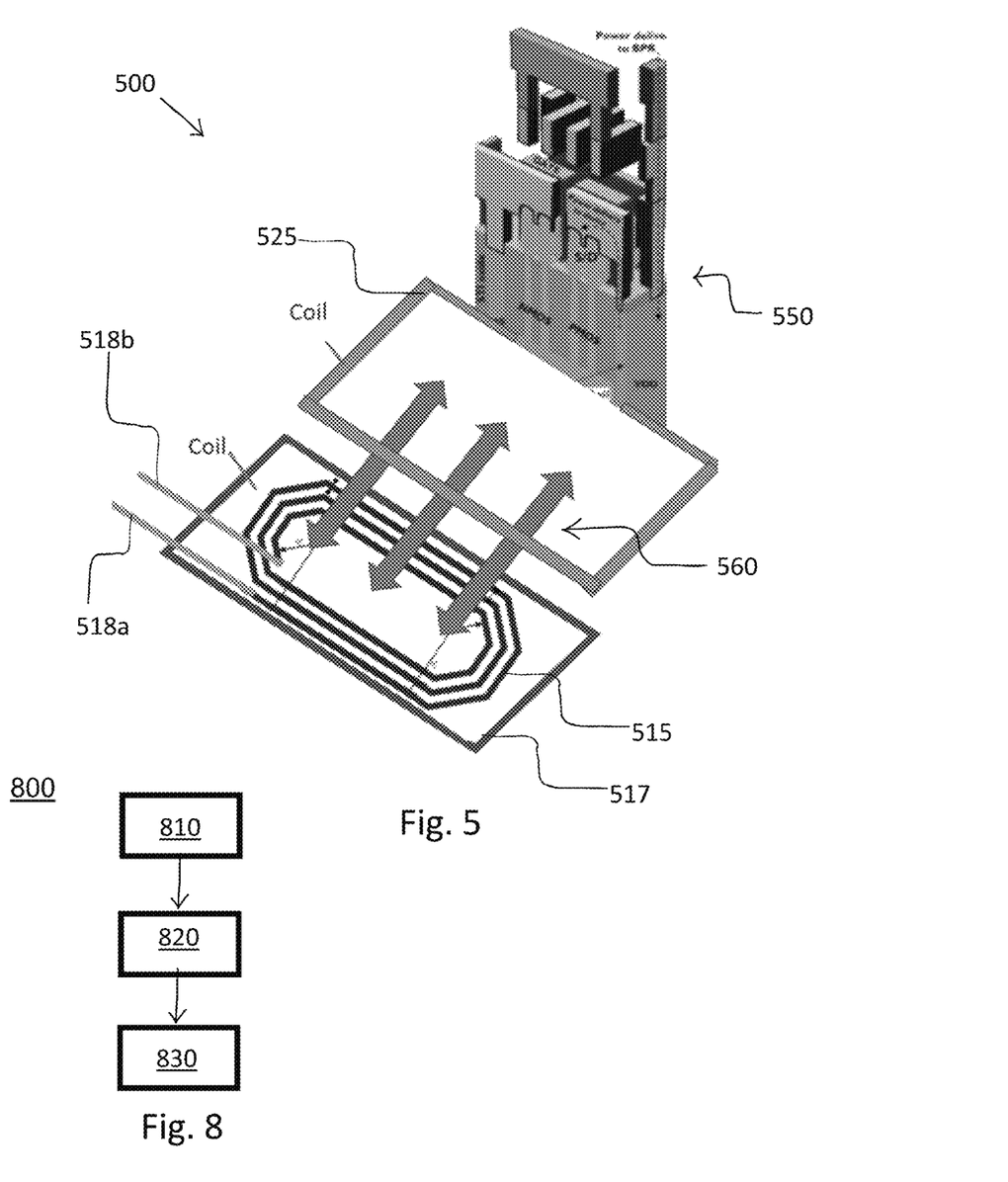
FIG. 5 illustrates a semiconductor die.
FIG. 8 illustrates a method of forming a semiconductor die.

FIG. 5 illustrates a semiconductor die 500. Features described herein with respect to the die of FIG. 5 can be combined with other dies described herein. FIG. 5 shows a backside inductor 515 in a plane 517. The backside inductor 515 can have leads 518a, 518b. The backside inductor 515 can couple inductively to a frontside inductor 525. FIG. 5 shows, for illustration a magnetic field 560 is shown as three double ended arrows, the field extending through the plane 517 of the backside inductor 515 and through a plane (offset from the plane 517) of a the frontside inductor 525.

The backside inductor 515 can have at least one winding forming an open loop in a plane 517 at the backside, as in FIG. 5. The leads 518a, 518b may make electrical/conductive contact with the ends of the open loop of the backside inductor 515. The leads 518a, 518b may be connected to an external source. The external source may provide any one or more of power, signal, data, clock signal, or security signal for the backside inductor 515 to couple to the frontside inductor 525.

A first lead 518a to the coil of the backside inductor 515 may extend in the same plane as the plane 517 of the coil and/or windings of the backside inductor 515. A second lead 518b may extend out of the plane 517, such as to avoid crossing the windings of the coil of the backside inductor 515.

As depicted in FIG. 5, the frontside inductor 525 can be in electrical contact with at least one transistor 550 (e.g. indirectly by conductive line(s) 235). For example, the frontside inductor 525 can be in electric contact with a drain. Alternatively, the frontside inductor 525 can be in electrical contact with the source or the gate of the transistor(s). The frontside inductor 525 can, for example, power the transistor(s), or provide signal(s) thereto. The transistor(s) 550 can be part of a circuit which is electrically coupled to the frontside inductor 525. The circuit may include the conductive line(s) and/or other conductive structures, e.g. for electrically connecting the transistor(s) to the frontside inductor 525.

The circuit, transistors, and/or frontside inductor 525 can be configured to receive at least of of a power transmission or signal. For example, the power and/or signal may reach the transistor(s) 550 having been passed through the frontside inductor 525, the power/signal having come inductively from the backside inductor 515 which may be electrically driven or may be inductively coupled (with reference to the example configurations of FIG. 4) to an external source.

A backside inductor 415, 515 can have at least one winding.

Referring also to FIG. 2 for illustration, the conductive line(s) 235 and/or power supply line(s) may run laterally in a trench. The conductive line(s) 235 can extend vertically into the semiconductor substrate 205. An insulating material such as a thin oxide and/or nitride may be between the line 235 and the semiconductor substrate 205. The top surface of the electrically conductive line 235 may be coplanar with the frontside surface of the semiconductor substrate 205 or may protrude from the frontside surface of the semiconductor substrate 205. The top surface of the electrically conductive line 235 may be contacted by one or more vias and/or one or more contact structures one or more transistors. The electrically conductive line 235 may extend to the back side of the semiconductor substrate 110 (e.g. if the semiconductor substrate is thin). In this case, the bottom surface of an electrically conductive structure may be the bottom surface of the electrically conductive line 235. As seen in FIG. 5, electrically conductive structure(s) which may include or connect to conductive line(s) 235 may connect to the transistors from the frontside inductor 525. A power coupling from front side to back side may be implemented with low effort, since the number of necessary process steps may be kept low.

Alternatively, a through substrate via may be connected to the electrically conductive line 235 (e.g. if the semiconductor substrate is thick). For example, the through substrate via may extend from a bottom surface of the electrically conductive line 235 to the backside of the semiconductor substrate 110. In this case, the bottom surface of the electrically conductive structure 140 may be the bottom surface of the through substrate via. The bottom surface of the electrically conductive structure 140 may be coplanar with the backside surface of the semiconductor substrate.

Figure 6:
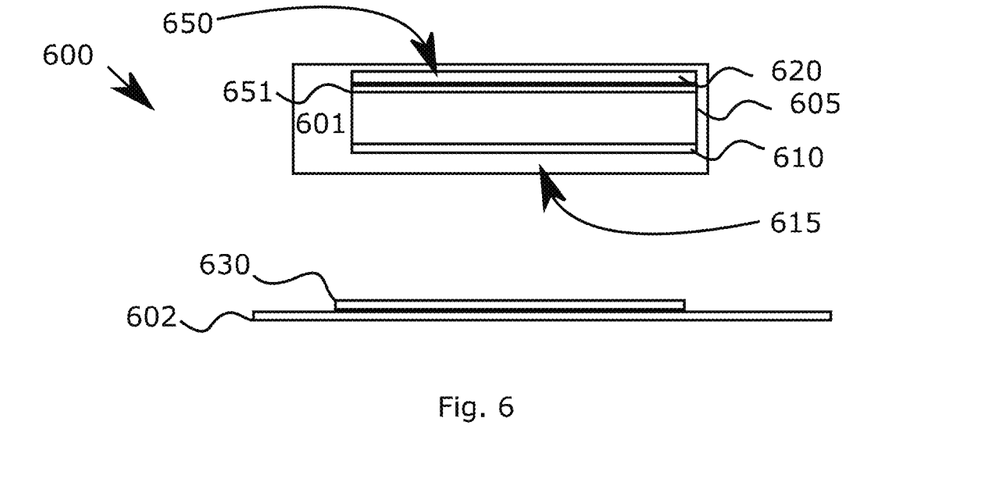
FIG. 6 shows an electronic device.

FIG. 6 shows an electronic device 600. The electronic device may include a die as described elsewhere herein. The device 600 can include a circuit board 602 which may include a circuit board inductor 630. The device can include a semiconductor die 601 including a die inductor 615 and circuitry 650. The inductors 615, 630 can inductively couple. The electronic device 600 can provide a power supply signal, a data signal or a clock signal from the circuit board inductor 630 through inductive coupling to the die inductor 615 and from the die inductor 615 to the circuitry 650. The circuitry 650 can include a plurality of transistors 651 at a frontside 620 of a semiconductor substrate 605. The die inductor 615 can be at a backside 610 of the semiconductor substrate 605.

Figure 7:
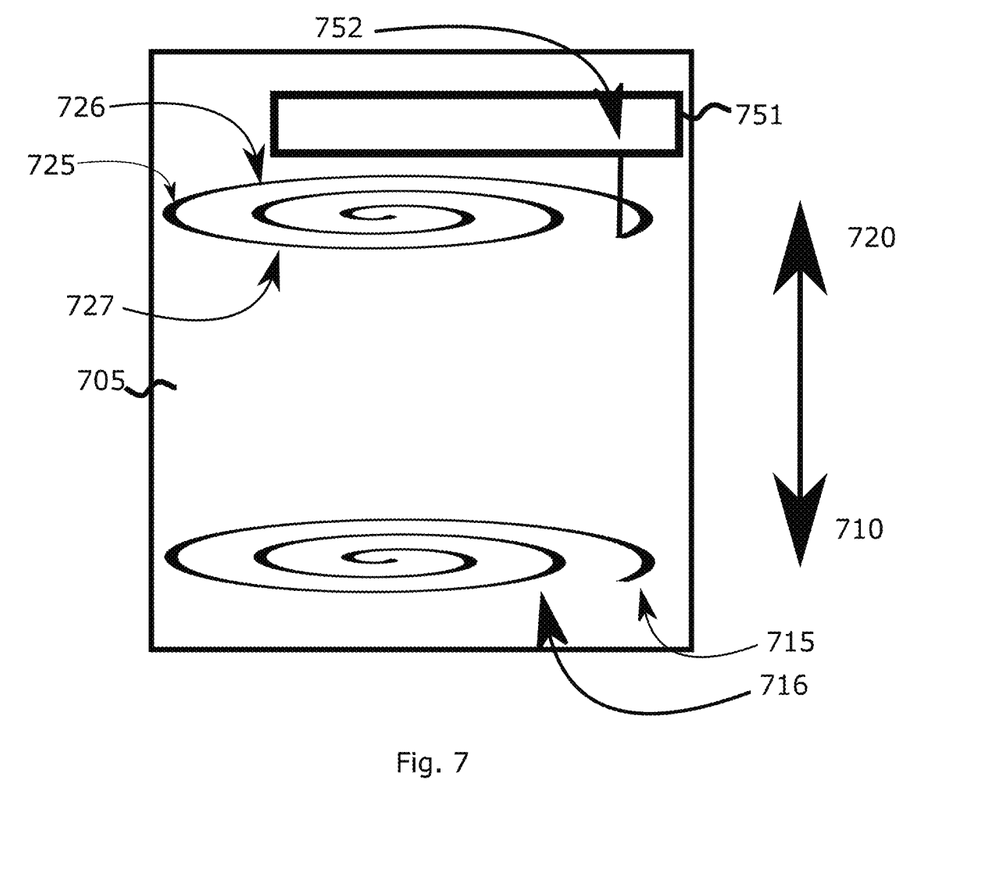
FIG. 7 illustrates a semiconductor die.

FIG. 7 shows a semiconductor die. Features described herein with respect to the die of FIG. 7 can be combined with other dies described herein. The die can include a plurality of transistors 751 at a frontside 720 of a semiconductor substrate 705, a backside coil 715 at a backside 710 of the semiconductor substrate 705, and a frontside coil 725 at the frontside 720 of the semiconductor substrate 705. The frontside coil 725 includes at least one winding 726. The backside coil 715 includes at least one winding 716. A least a part of the frontside coil 725 is formed by an electrically conductive line 727 (e.g. a power a supply line) extending into the semiconductor substrate 705. The frontside coil 725 can be electrically connected to a source region or a drain region 752 of a transistor of the plurality of transistors 751.

FIG. 8 illustrates a method of forming a semiconductor die. Features described herein with respect to the die of FIG. 8 can be combined with other dies described herein. The method 800 includes forming 810 a plurality of transistors at a frontside of a semiconductor substrate, forming 820 a frontside inductor at the frontside of the semiconductor substrate, and forming 830 a backside inductor at a backside of the semiconductor substrate. The frontside inductor and the backside inductor are configured to be inductively coupled.

At least a part of the frontside inductor can be formed with an electrically conductive line (e.g. power supply line) arranged vertically between a gate of a transistor of the plurality of transistors and the semiconductor substrate. Alternatively/additionally, at least a part of the frontside inductor can be formed by an electrically conductive line (e.g. a power supply line) extending into the semiconductor substrate. The method can include forming any feature described with respect to any die described herein.

Figure 9:
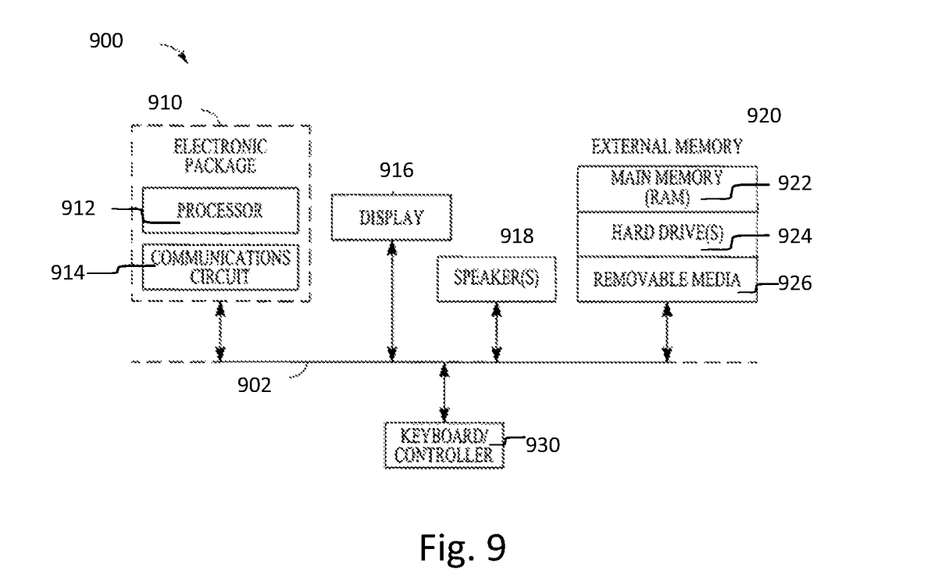
FIG. 9 is a block diagram of an electronic apparatus.

FIG. 9 is a block diagram of an electronic apparatus 900 incorporating at least one electronic device, die, and/or method described herein. Electronic apparatus 900 is merely one example of an electronic apparatus in which forms of the electronic assemblies, dies, and/or methods described herein may be used. Examples of an electronic apparatus 900 include, but are not limited to, personal computers, tablet computers, mobile telephones, game devices, MP3 or other digital music players, etc. In this example, electronic apparatus 900 comprises a data processing system that includes a system bus 902 to couple the various components of the electronic apparatus 900. System bus 902 provides communications links among the various components of the electronic apparatus 900 and may be implemented as a single bus, as a combination of busses, or in any other suitable manner.

An electronic assembly 910 as describe herein may be coupled to system bus 902. The electronic assembly 910 may include any circuit or combination of circuits. In one embodiment, the electronic assembly 910 includes a processor 912 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit. The electronic assembly may include any of the dies as described herein.

Other types of circuits that may be included in electronic assembly 910 are a custom circuit, an application-specific integrated circuit (ASIC), or the like, such as, for example, one or more circuits (such as a communications circuit 914) for use in wireless devices like mobile telephones, tablet computers, laptop computers, two-way radios, and similar electronic systems. The IC can perform any other type of function.

The electronic apparatus 900 may also include an external memory 920, which in turn may include one or more memory elements suitable to the particular application, such as a main memory 922 in the form of random access memory (RAM), one or more hard drives 924, and/or one or more drives that handle removable media 926 such as compact disks (CD), flash memory cards, digital video disk (DVD), and the like.

The electronic apparatus 900 may also include a display device 916, one or more speakers 918, and a keyboard and/or controller 930, which can include a mouse, trackball, touch screen, voice—recognition device, or any other device that permits a system user to input information into and receive information from the electronic apparatus 900.

Figure 10:
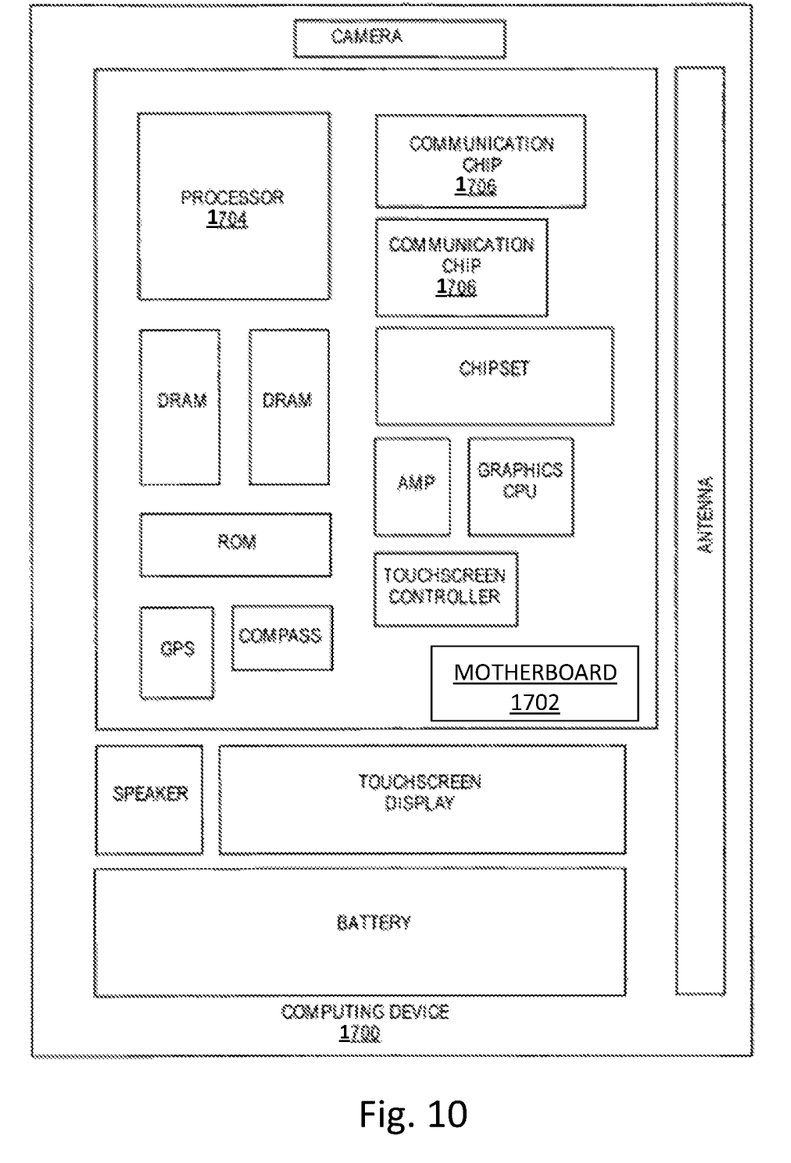
FIG. 10 is a block diagram of a computing device.

FIG. 10 illustrates a computing device 1700. The computing device 1700 can include a die as described herein. The computing device 1700 can house a board 1702. The board 1702 may include a number of components, including but not limited to a processor 1704 and at least one communication chip 1706. The processor 1704 is physically and electrically coupled to the board 1702. In some implementations the at least one communication chip 1706 is also physically and electrically coupled to the board 1702. In further implementations, the communication chip 1706 is part of the processor 1704. The communication chip 1706 and/or processor 1704 can include a die as described herein.

Depending on its applications, computing device 1700 may include other components that may or may not be physically and electrically coupled to the board 1702. These other components include, but are not limited to, volatile memory (e.g., DRAM), non-volatile memory (e.g. ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1706 can enable wireless communications for the transfer of data to and from the computing device 1700. The term "wireless" and its derivatives may be used to describe circuits, devices, systems, methods, techniques, communications channels, etc., that may communicate data through the use of modulated electromagnetic radiation. The term does not imply that the associated devices do not contain any wires, although in some embodiments they might not. The communication chip 1706 may implement any of a number of wireless standards or protocols, including but not limited to Wi-Fi (IEEE 802.11 family), WiMAX® (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth®, derivatives thereof, as well as any other wireless protocols that are designated as 3G, 4G, 5G, and beyond. The computing device 1700 may include a plurality of communication chips 1706. For instance, a first communication chip 1706 may be dedicated to shorter range wireless communications such as Wi-Fi and Bluetooth and a second communication chip 1706 may be dedicated to longer range wireless communications such as GPS, EDGE, GPRS, CDMA, WiMAX, LTE, Ev-DO, and others.

The processor 1704 of the computing device 1700 includes an integrated circuit die packaged within the processor 1704, e.g. a die as described herein. In some implementations of the invention, the integrated circuit die of the processor includes one or more devices that are assembled in an ePLB or eWLB based POP package that that includes a mold layer directly contacting a substrate, in accordance with implementations of the invention. The term "processor" may refer to any device or portion of device that processes electronic data from registers and/or memory to transform that electronic data into other electronic data that may be stored in registers and/or memory. The communication chip 1706 also includes an integrated circuit die packaged (e.g. a die as described herein) within the communication chip 1706. In accordance with another implementation of the invention, the integrated circuit die of the communication chip includes one or more devices that are assembled in an ePLB or eWLB based POP package that that includes a mold layer directly contacting a substrate, in accordance with implementations of the invention.

The examples described herein may aid in shrinking semiconductor dies and/or devices particularly by reducing the footprint of structure within the die. The inductive coupling of power, signal, and the like, as shown herein such as by using a frontside inductor and/or backside inductor may replace, at least partially, vias and other similar space-taking structures for power/signal coupling to transistor(s) of dies. For example, the frontside inductor may provide signal/power without requiring electrical contact to the outside of the die, which may save space. Alternatively/additionally, the efficient use of space in the die by the inductor(s) described herein can allow for higher transistor densities.

Herein, the inductor(s) may be part of a power delivery network (PDN) which may include electrically conductive lines, power lines such as buried power rails, and/or power supply lines. Particularly, the frontside inductor(s) can be in electrical contact with power supply lines and/or buried power rails, e.g. for powering transistor(s).

The examples described herein, e.g. those utilizing inductor(s) for power/signal transmission can avoid high current densities that may otherwise occur when, for example, power is delivered by through-semiconductor vias and/or with electrical contacts and the like.

Herein, the inductor(s) can include and/or be electrically connected to electrically conductive lines, power supply lines, and/or buried power rails in the front end of line (FEOL). The rails/lines may power transistors and/or transmit signals to/from the transistors. The inductor(s) herein can have coils of low resistance, e.g. made of metal, as described herein. The backside inductor(s) described herein can be formed by backside metallization processes, e.g. of the semiconductor die. External coils, e.g. from outside the package can couple to the inductor(s) of the die.

The examples herein may provide power and/or signal exclusively by the inductors. The dies/devices described herein may lack power delivery vias from the frontside of the die. Alternatively/additionally, no backside through semiconductor vias may be present. This can reduce the footprint of the die. Alternatively/additionally, the lack of electrical contacts may be advantageous for many reasons. Reducing the footprint is one possibility. Another is that it is possible to reduce or eliminate the need for electrostatic discharge (ESD) protection.

The dies herein and associated inductively coupled mechanisms can be used for signal/power transformation, signal/clock distribution, and/or chip to chip distribution (e.g. of power and/or signals). Security applications are also possible, e.g. by utilizing the signal/power delivery in combination with circuitry that recognizes signal/power characteristic(s), as described herein, e.g. before allowing access and/or unlocking the device.

Herein has been described examples in which signal/power is inducted in power lines and/or rails by single or multiple layer backside metallization. Backside metallizaiton can be used to distribute signals and/or power, including to multiple regions of the die/device. External signals and/or power sources can also be coupled in. This can increase efficiency and/or reduce device footprint.

The inductor(s) described herein may simplify and/or at least partially replace interconnect layers and/or interconnect structures which might be otherwise used for electrically coupling the transistors to other components such as components external to the semiconductor die. As suggested herein, the number density of conductive vias may be reduced (possibly to 0 in at least some examples), which may reduce the footprint of the semiconductor die.

Herein, coupling to an external inductor may be an external inductor on a circuit board such as a printed circuit board. Dies described herein may be alternatively/additionally coupled (such as by bonding or the like) to other dies, such as to form a semiconductor package and/or device.

Herein there can be a thin material such as an insulator, oxide, and/or nitride between a semiconductor substrate and a metal, particularly between the semiconductor substrate and any electrically conductive lines. For example, there can be a thin oxide and/or nitride layer between the semiconductor substrate and the electrically conductive lines such as power lines as described herein which may be metallic. The thin material may aid in preventing metal migration from the conductive lines into the semiconductor material. For example, in the formation of the die, a trench is formed by etching, and the surface of the trench is oxidized before depositing metal in the trench which form the conductive lines.

A semiconductor device described herein may be a semiconductor package comprising a semiconductor die. The semiconductor device may be a processor (e.g. CPU, GPU or DSP), a memory or any other integrated circuit. The semiconductor die may be a processor die (e.g. CPU, GPU or DSP), a memory die or any other integrated circuit die.

For convenience and/or conciseness, the following enumerated examples are herewith disclosed.

Example 1 is a semiconductor die, comprising: a plurality of transistors at a frontside of a semiconductor substrate, a backside inductor at a backside of the semiconductor substrate; and a frontside inductor at the frontside of the semiconductor substrate. The frontside inductor and the backside inductor are configured to be inductively coupled. A single winding of the frontside inductor 325 may save space and be adequate for providing inductive coupling for power, data, and/or signals.

There may be additional coupled frontside and backside inductors 325, 315 elsewhere, e.g. oriented for coupling such that the windings of the inductors 325, 315 are at least partially aligned (e.g. for efficient induction) when projected in a direction perpendicular to semiconductor substrate 105. Magnetic fields of the front and back inductors can efficiently pass through the windings for efficient coupling.

Example 2 is the semiconductor die of enumerated example 1, with at least a part of the frontside inductor being formed by an electrically conductive line (e.g. a power supply line) arranged vertically between a gate of a transistor of the plurality of transistors and the semiconductor substrate.

Example 3 is the semiconductor die of any preceding enumerated example, with at least a part of the frontside inductor being formed by an electrically conductive line (e.g. a power supply line) extending into the semiconductor substrate.

Example 4 is the semiconductor die of any preceding enumerated example, and the frontside inductor including a single winding.

Example 5 is the semiconductor die of any preceding enumerated example, with at least a part of the frontside inductor being formed by a metal line arranged above the plurality of transistors.

Example 6 is the semiconductor die of any preceding enumerated example, with the frontside inductor being electrically connected to a source region or a drain region of a transistor of the plurality of transistors.

Example 7 is the semiconductor die of any preceding enumerated example, with a material of the frontside inductor and the backside inductor including a metal such as copper, particularly at least 90% copper or at least 99%.

Example 8 is the semiconductor die of any preceding enumerated example, which also comprises circuitry comprising the plurality of transistors. The semiconductor die is configured to provide at least one of: a power supply signal, a data signal, or a clock signal from the backside inductor through inductive coupling to the front side inductor and from the front side inductor to the circuitry.

Example 9 is the semiconductor device of example 8, wherein the circuitry is configured to be unlocked by at least one of the data signal, the power supply signal, or the clock signal.

Example 10 is the semiconductor die of any preceding enumerated example, wherein the electrically conductive line (e.g. power supply line) includes at least one of tungsten or ruthenium.

Example 11 is the semiconductor die of any preceding enumerated example, wherein the backside inductor includes at least one winding forming an open loop in a plane at the backside.

Example 12 is the semiconductor die of any preceding enumerated example, wherein the backside inductor is electrically connected to a second backside inductor at the backside of the semiconductor substrate. The second backside inductor is configured to inductively couple to an external inductor or a second frontside inductor at the frontside of the semiconductor substrate.

Example 13 is the semiconductor die of any preceding enumerated example, and the backside inductor is formed in a plurality of layers of metallizations.

Example 14 is the semiconductor die of any preceding enumerated example, and the backside inductor comprises at least one winding.

Example 15 is the semiconductor die of any preceding enumerated example, and the transistors are FinFETs.

Example 16 is an electronic device comprising a circuit board including a circuit board inductor; and a semiconductor die which includes a die inductor and circuitry. The electronic device is configured to provide a power supply signal, a data signal or a clock signal from the circuit board inductor through inductive coupling to the die inductor and optionally from the die inductor to the circuitry.

Example 17 is the electronic device of claim 16, and the circuitry includes a plurality of transistors at a frontside of a semiconductor substrate. The die inductor is arranged at a backside of the semiconductor substrate.

Example 18 is a semiconductor die, comprising: a plurality of transistors at a frontside of a semiconductor substrate, a backside coil at a backside of the semiconductor substrate, and a frontside coil at the frontside of the semiconductor substrate. The frontside coil includes at least one winding. The backside coil includes at least one winding. At least a part of the frontside coil is formed by an electrically conductive line (e.g. a power supply line) extending into the semiconductor substrate.

Example 19 is the semiconductor die of claim 18, and the frontside coil is electrically connected to a source region or a drain region of a transistor of the plurality of transistors.

Example 20 is a method of forming a semiconductor die, comprising: forming a plurality of transistors at a frontside of a semiconductor substrate, forming a frontside inductor at the frontside of the semiconductor substrate, and forming a backside inductor at a backside of the semiconductor substrate. The frontside inductor and the backside inductor are configured to be inductively coupled.

Example 21 is the method of forming a semiconductor die of claim 20, further comprising: forming at least a part of the frontside inductor by an electrically conductive line (e.g. a power supply line) arranged vertically between a gate of a transistor of the plurality of transistors and the semiconductor substrate.

Example 22 is the method of forming a semiconductor die of claim 20 or 21, wherein at least a part of the frontside inductor is formed by an electrically conductive line (e.g. a power supply line) extending into the semiconductor substrate.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor or other programmable hardware component. Thus, steps, operations or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:
1. A semiconductor die, comprising:
 a plurality of transistors at a frontside of a semiconductor substrate,
 a backside inductor at a backside of the semiconductor substrate; and
 a frontside inductor at the frontside of the semiconductor substrate, wherein the frontside inductor and the backside inductor are configured to be inductively coupled,
 wherein at least a part of the frontside inductor is formed by an electrically conductive line extending into the semiconductor substrate.
2. The semiconductor die of claim 1, wherein at least a part of the frontside inductor is formed by an electrically conductive line arranged vertically between a gate of a transistor of the plurality of transistors and the semiconductor substrate.
3. The semiconductor die of claim 1, wherein the frontside inductor has a single winding.
4. The semiconductor die of claim 1, wherein at least a part of the frontside inductor is formed by a metal line arranged above the plurality of transistors.
5. The semiconductor die of claim 1, wherein the frontside inductor is electrically connected to a source region or a drain region of a transistor of the plurality of transistors.
6. The semiconductor die of claim 1, wherein a material of the frontside inductor and the backside inductor includes metal.
7. The semiconductor die of claim 1, further comprising:
 circuitry which includes the plurality of transistors,
 wherein the semiconductor die is configured to provide at least one of: a power supply signal, a data signal, or a clock signal from the backside inductor through inductive coupling to the frontside inductor and from the frontside inductor to the circuitry.
8. The semiconductor device of claim 7, wherein the circuitry is configured to be unlocked by at least one of the data signal, the power supply signal, or the clock signal.
9. The semiconductor die of claim 1, wherein the electrically conductive line includes at least one of tungsten or ruthenium.
10. The semiconductor die of claim 1, wherein the backside inductor includes at least one winding forming an open loop in a plane at the backside.
11. The semiconductor die of claim 1, wherein the backside inductor is electrically connected to a second backside inductor at the backside of the semiconductor substrate,
 wherein the second backside inductor is configured to inductively couple to an external inductor or a second frontside inductor at the frontside of the semiconductor substrate.
12. The semiconductor die of claim 1, wherein the backside inductor is formed in a plurality of layers of metallizations.
13. The semiconductor die of claim 1, wherein the backside inductor includes at least one winding.
14. The semiconductor die of claim 1, wherein the transistors are FinFETs.
15. An electronic device comprising:
 a circuit board including a circuit board inductor; and
 a semiconductor die including a die inductor and circuitry,
 wherein the electronic device is configured to provide a power supply signal, a data signal or a clock signal from the circuit board inductor through inductive coupling to the die inductor and from the die inductor to the circuitry.
16. The electronic device of claim 15, wherein the circuitry includes a plurality of transistors at a frontside of a semiconductor substrate, and wherein the die inductor is arranged at a backside of the semiconductor substrate.

17. A semiconductor die, comprising:
a plurality of transistors at a frontside of a semiconductor substrate,
a backside coil at a backside of the semiconductor substrate, and
a frontside coil at the frontside of the semiconductor substrate,
wherein the frontside coil includes at least one winding, the backside coil includes at least one winding, and
wherein at least a part of the frontside coil is formed by an electrically conductive line extending into the semiconductor substrate.

18. The semiconductor die of claim 17, wherein:
the frontside coil is electrically connected to a source region or a drain region of a transistor of the plurality of transistors.

19. A method of forming a semiconductor die, comprising:
forming a plurality of transistors at a frontside of a semiconductor substrate,
forming a frontside inductor at the frontside of the semiconductor substrate, and forming a backside inductor at a backside of the semiconductor substrate;
wherein the frontside inductor and the backside inductor are configured to be inductively coupled,
wherein at least a part of the frontside inductor is formed by an electrically conductive line extending into the semiconductor substrate.

20. The method of forming a semiconductor die of claim 19, further comprising:
forming at least a part of the frontside inductor by an electrically conductive line arranged vertically between a gate of a transistor of the plurality of transistors and the semiconductor substrate.

* * * * *